(12) United States Patent
Duve

(10) Patent No.: US 6,404,267 B1
(45) Date of Patent: Jun. 11, 2002

(54) HIGH SIDE MOSFET DRIVE

(75) Inventor: Jeff Duve, Efland, NC (US)

(73) Assignee: Cooper Industries, Houston, TX (US)

( * ) Notice: Subject to any disclaimer, the term of this patent is extended or adjusted under 35 U.S.C. 154(b) by 0 days.

(21) Appl. No.: 09/619,841

(22) Filed: Jul. 20, 2000

Related U.S. Application Data

(60) Provisional application No. 60/144,960, filed on Jul. 21, 1999.

(51) Int. Cl.$^7$ ................................................. H01J 19/82
(52) U.S. Cl. ...................................... 327/531; 327/447
(58) Field of Search ................................ 327/423, 424, 327/427, 434, 447–448, 381, 531, 587–588, 533, 108

(56) References Cited

U.S. PATENT DOCUMENTS

| | | | | |
|---|---|---|---|---|
| 5,010,439 | A | * 4/1991 | Zisa et al. | 327/434 |
| 5,506,539 | A | * 4/1996 | Kelly et al. | 327/427 |
| 5,886,563 | A | * 3/1999 | Nasila | 327/423 |
| 6,046,622 | A | * 4/2000 | Miles | 327/427 |
| 6,191,625 | B1 | * 2/2001 | Wachter et al. | 327/108 |

OTHER PUBLICATIONS

Interfacing Power MOSFETS to Logic Devices, Taken from *Motorola Semiconductor Application Note*, by Ken Berringer, 1990.

Introduction to Power MOSFETS and Their Applications, Taken from *Fairchild Semiconductor*, Rev B—Oct. 1998.
MOSFET Basics—Contents, Taken from *Fairchild Semiconductor* by K.S. Oh, Rev D—Jul. 2000.
Designing with TMOS Power MOSFETS, Taken from *Motorola Inc.* 1983, by Kim Gauen.
Gate Drive Characteristiics and Requirements for HEXFET'S, *AN–937 (v.Int)* (Date Unknown).
HV Floating MOS–Gate Driver ICS (HEXFET is a Trademark of International Recifier), Taken from *International Rectifier* (Date Unknown).
High and Low Side Driver, Taken from *International Rectifier*, Data Sheet No.: PD60147–L, Apr. 2000.

* cited by examiner

Primary Examiner—Terry D. Cunningham
Assistant Examiner—Long Nguyen
(74) Attorney, Agent, or Firm—Niro, Scavone Haller & Niro

(57) ABSTRACT

An improved circuit for activating a high side mosfet drive during a predetermined phase of the A/C cycle. The circuit includes an electronic switch which is connected to an A/C line. The switch operates between an open and closed position. Also included is a mosfet drive connected to the A/C line. The mosfet drive is activated when the switch is in an open position and is deactivated when the switch is in a closed position. The circuit may also include a capacitor connected to the A/C line. The capacitor is charged during the positive phase of the A/C cycle and powers the mosfet drive during the negative portion of the A/C cycle when the switch is in an open position.

1 Claim, 1 Drawing Sheet

HIGH SIDE MOSFET DRIVE

This application claims priority to U.S. Provisional Patent Application Serial No. 60/144,960, filed Jul. 21, 1999.

BACKGROUND OF THE INVENTION

The present invention relates to a new circuit design which permits precision triggering of a load during predetermined phases of an A/C cycle and to control the activation of a load. In prior art applications, a triac or thyristor is often used to perform phase control of the A/C cycle. In one common application involving outdoor electric lights, phase control of the A/C cycle is used to dim the light source. A drawback in using a triac or thyristor, however, is that the device will only deactivate at zero crossing in the A/C cycle. Thus, to phase control a load with a triac or thyristor, it must be triggered sometime after zero crossing which will lead to an increase in electromagnetic interference (EMI) and the ability to deactivate a load when desired.

SUMMARY OF THE INVENTION

The present invention solves the above mentioned design problems by providing circuitry which uses a high side mosfet drive that may be activated and deactivated at any point in the A/C cycle. To do this, the circuitry of the present invention uses an A/C line to activate the mosfet drive and to charge a capacitor during the positive phase of the A/C cycle. During the negative phase, the circuitry is designed to use the discharge of the capacitor to activate the mosfet drive, if desired.

BRIEF DESCRIPTION OF THE DRAWINGS

The novel features which are characteristic of the present invention are set forth in the appended claims. The invention itself, however, together with further objects and attendant advantages, will be best understood by reference to the following description taken in connection with the accompanying drawings in which:

DETAILED DESCRIPTION OF THE PREFERRED EMBODIMENTS

Set forth below is a description of what is currently believed to be the preferred embodiment or best example of the invention claimed. Future and present alternatives and modifications to the preferred embodiment are contemplated. Any alternates or modifications in which insubstantial changes in function, purpose, structure or result are intended to be covered by the claims of this patent.

Figure 1:
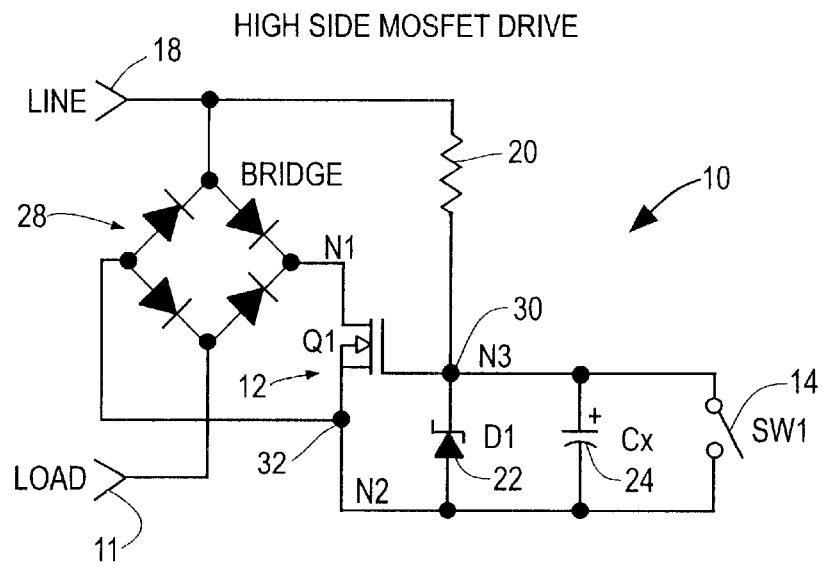
FIG. 1 is a block diagram showing the circuitry of the present invention.

FIG. 1 shows a preferred embodiment of the present invention in which circuit 10 is used to trigger a mosfet drive 12 in a high side configuration. To activate load 11 at a predetermined time in the A/C cycle, a microprocessor or some other type of logic or linear device(not shown) is used to open and close electronic switching device 14 which is shown in an open position in FIG. 1. Other switching devices that may be used with the present invention include, but are not limited to, transistors, mosfet drives, triacs, thyristors, and other devices known to those with skill in the art.

Once switch 14 is in an open position, current flows from power line 18 through resistor 20 which is used to limit the current through zener diode 22 which limits the voltage at the gate of mosfet drive 12. When the switch is in an open position, mosfet drive 12 is activated and is driven by the current. The current during the positive phase of the A/C cycle is also used to charge capacitor 24. The charge stored in capacitor 24 is discharged and used to continue the activation of mosfet drive 12 during the negative phase of the A/C cycle, if desired by leaving switch open during the negative phase. A zener diode bridge 28 is used to restrict the directional flow of the current as is known to those of skill in the art.

To deactivate the load, electronic switch 14 is closed which results in a short in the circuit at nodes 30 and 32. This, in turn, deactivates mosfet drive 12 and the current to the load.

Figure 2:
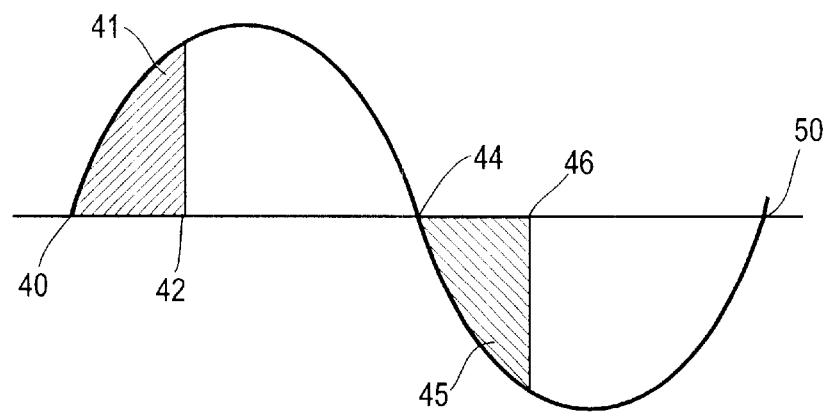
FIG. 2 shows how the circuitry may be use to activate a load during select portions of the A/C cycle.

As shown in FIG. 2, activation and deactivation may be achieved at any point in the A/C cycle. For example, when switch 14 is programmed to open at zero crossing 40 and to remain open until point 42 in the cycle, activation of the load will be accomplished during the entire phase designated as 41. The circuit will then remain in a deactivated state until switch 14 is again opened between points 44 and 46. This, again activates mosfet drive 12 and load 11.

By being able to control the opening and closing of switch 14 with precision, activation of the load may be accomplished at any point in the A/C cycle. This, in turn, reduces the associated electromagnetic interference (EMI) and allows for the precise activation of a desired load, including the dimming of an outdoor or indoor light.

It should be understood that various changes and modifications to the preferred embodiment described would be apparent to those skilled in the art. Changes and modifications can be made without departing from the spirit and scope of the present invention and without diminishing its intended advantages. It is, therefore, intended that such changes and modifications be covered by the following claims.

What is claimed is:

1. An improved circuit for activating a high side mosfet drive during a predetermined phase of an A/C cycle comprising:

an electronic switch connected to an A/C line, said switch operates between an open and closed position;

the high side mosfet drive connected to said A/C line;

wherein said high side mosfet drive is activated when said switch is in an open position and is deactivated when said switch is in a closed position; and a capacitor connected to the A/C line, said capacitor is charged during the positive phase of the A/C cycle and powers said high side mosfet drive during the negative portion of the A/C cycle when said switch is in an open position.

* * * * *